(12) United States Patent
Ahn et al.

(10) Patent No.: US 11,518,921 B2
(45) Date of Patent: Dec. 6, 2022

(54) ANTISTATIC POLYIMIDE-BASED FILM AND FLEXIBLE DISPLAY PANEL USING SAME

(71) Applicants: SK Innovation Co., Ltd., Seoul (KR); SK IE Technology Co., Ltd., Seoul (KR)

(72) Inventors: Jong Nam Ahn, Daejeon (KR); Hye Jin Kim, Daejeon (KR)

(73) Assignees: SK Innovation Co., Ltd., Seoul (KR); SK ie technology Co., Ltd., Seoul (KR)

(*) Notice: Subject to any disclaimer, the term of this patent is extended or adjusted under 35 U.S.C. 154(b) by 264 days.

(21) Appl. No.: 17/034,702

(22) Filed: Sep. 28, 2020

(65) Prior Publication Data
US 2021/0095174 A1 Apr. 1, 2021

(30) Foreign Application Priority Data
Sep. 30, 2019 (KR) .......... 10-2019-0120635

(51) Int. Cl.
| | |
|---|---|
| *C09K 3/16* | (2006.01) |
| *H05K 5/03* | (2006.01) |
| *C08G 73/14* | (2006.01) |
| *C08J 7/044* | (2020.01) |
| *H05K 5/00* | (2006.01) |

(52) U.S. Cl.
CPC .............. *C09K 3/16* (2013.01); *C08G 73/14* (2013.01); *C08J 7/044* (2020.01); *H05K 5/03* (2013.01); *C08J 2379/08* (2013.01); *C08J 2483/06* (2013.01); *H05K 5/0017* (2013.01)

(58) Field of Classification Search
CPC .. C09K 3/16; H05K 5/03; C08J 7/044; C08G 73/14
USPC ...................................................... 428/213
See application file for complete search history.

(56) References Cited

U.S. PATENT DOCUMENTS

| | | | |
|---|---|---|---|
| 9,676,960 B2 | 6/2017 | Kim et al. | |
| 9,706,649 B2 | 7/2017 | Jung et al. | |
| 9,791,597 B2 | 10/2017 | Zheng | |
| 10,280,336 B2 | 5/2019 | Shin et al. | |
| 10,591,761 B2 | 3/2020 | Jee et al. | |
| 10,815,378 B2 | 10/2020 | Kim et al. | |
| 2011/0171445 A1 | 7/2011 | Jung et al. | |

(Continued)

FOREIGN PATENT DOCUMENTS

| | | |
|---|---|---|
| JP | 2011508039 A | 3/2011 |
| KR | 101248671 B1 | 3/2013 |

(Continued)

*Primary Examiner* — Tahseen Khan
(74) *Attorney, Agent, or Firm* — The Webb Law Firm

(57) ABSTRACT

Provided is an antistatic polyimide-based film. More particularly, as an antistatic polyimide-based film for a window cover for protecting a surface of a display device, a window cover film having a protective film formed on the polyimide-based film provides an improvement to a problem of not being used as a film for a display window cover because a portion of the protective film remains on a base layer or a hard coating layer without being peeled off due to static electricity in the protective film or the base layer, or a hard coating layer, or the hard coating layer is peeled off with some or all of the protective film when the protective film is peeled off.

12 Claims, 1 Drawing Sheet

(56) References Cited

U.S. PATENT DOCUMENTS

| | | |
|---|---|---|
| 2013/0207294 A1 | 8/2013 | Jeon et al. |
| 2016/0024348 A1 | 1/2016 | Kim et al. |
| 2016/0046830 A1* | 2/2016 | Kim .................. C08G 77/045 522/170 |
| 2017/0117523 A1* | 4/2017 | Kim .................. H01M 50/411 |
| 2017/0313901 A1* | 11/2017 | Lee .................. C09D 143/04 |
| 2017/0342224 A1* | 11/2017 | Chae ................ G09F 9/301 |
| 2018/0113350 A1* | 4/2018 | Jee .................... C08J 7/046 |
| 2019/0033494 A1* | 1/2019 | Kim .................. B32B 27/40 |
| 2019/0077960 A1* | 3/2019 | Kim .................. C08L 79/08 |
| 2019/0256658 A1 | 8/2019 | Odle et al. |
| 2019/0390057 A1* | 12/2019 | Miyamoto ......... C09D 179/08 |
| 2020/0339769 A1* | 10/2020 | Lee .................. C08G 73/1039 |
| 2021/0070017 A1* | 3/2021 | Wilson .............. B32B 17/1055 |
| 2021/0100120 A1* | 4/2021 | Ahn .................. C08J 7/042 |

FOREIGN PATENT DOCUMENTS

| | | |
|---|---|---|
| KR | 1020130074167 A | 7/2013 |
| KR | 1020130078764 A | 7/2013 |
| KR | 101380033 B1 | 4/2014 |
| KR | 101401733 B1 | 5/2014 |
| KR | 1020150113916 A | 10/2015 |
| KR | 1020160013402 A | 2/2016 |
| KR | 1020160020615 A | 2/2016 |
| KR | 1020160117396 A | 10/2016 |
| KR | 1020180018307 A | 2/2018 |
| KR | 1020180044216 A | 5/2018 |
| KR | 101922169 B1 | 11/2018 |
| KR | 1020190029110 A | 3/2019 |
| KR | 1020190029790 A | 3/2019 |
| KR | 1020190078225 A | 7/2019 |
| KR | 1020190090300 A | 8/2019 |

* cited by examiner

ANTISTATIC POLYIMIDE-BASED FILM AND FLEXIBLE DISPLAY PANEL USING SAME

CROSS-REFERENCE TO RELATED APPLICATION

This application claims priority to Korean Patent Application No. 10-2019-0120635 filed Sep. 30, 2019, the disclosure of which is hereby incorporated by reference in its entirety.

TECHNICAL FIELD

The following disclosure relates to an antistatic polyimide-based film and a flexible display panel using the same.

BACKGROUND

Thin display devices such as liquid crystal display devices or organic light emitting diode display devices are realized in the form of a touch screen panel, and thus have been widely used for various smart devices characterized by portability, which include various wearable devices, as well as smart phones, and tablet PCs.

Such portable touch screen panel-based display devices have a window cover for protecting a display device on a display panel in order to protect the display panel from scratches or external impacts. In recent years, the window cover is being replaced with a film made of a plastic material instead of glass.

Polyethylene terephthalate (PET), polyethersulfone (PES), polyethylene naphthalate (PEN), polyacrylate (PAR), polycarbonate (PC), polyimide (PI), polyaramid (PA), polyamide-imide (PAI), and the like, which are flexible and have transparency, have been used as a base material of such a window cover film.

The window cover film is susceptible to defects such as inclusion of foreign substances, scratches, or the like during transfer or storage processes. To prevent these defects, the film is stored or transferred after a protective film is attached onto the film.

The aforementioned protective film has a predetermined adhesive force because the protective film should not be peeled off during the transfer or storage of the window cover film, or should not be slid around by external forces. Also, when the protective film is stacked on a display panel as a window cover, the protective film should have a characteristic of being easily peeled off from a film for a window cover as well.

However, the protective film tends to increase an adhesive strength of the protective film due to static electricity when the protective film is peeled off from the window cover film. In this case, because an adhesive component of the protective film often tends to remain on a surface of the window cover film without being completely removed therefrom, this often acts as a drawback during subsequence processes or in optical characteristics, or causes defects.

In addition, the film for a window cover is attached to a display panel by means of an optically clear adhesive layer such as an optically clear adhesive (OCA), or an optically clear resin (OCR) when the film is attached to the display panel. In this case, when the protective film is peeled off due to static electricity, the protective film is not peeled off, but the window cover film and the OCA or OCR layer which should not be peeled off are peeled off, resulting in defects. Also, invisible fine peeling-off occurs, resulting in frequent occurrence of defects in optical characteristics.

Also, when a hard coating layer is formed on the film for a window cover to reinforce surface characteristics, optical characteristics, and mechanical characteristics, a phenomenon in which the hard coating layer is peeled off from the window cover film due to the static electricity occurs when the protective film attached to the hard coating layer is peeled off, which often serves as a defect.

RELATED ART DOCUMENT

Patent Document

Patent Document 1: Korean Patent Laid-Open Publication No. 10-2013-0074167 (Jul. 4, 2013)

SUMMARY

An embodiment of the present invention is directed to providing a window cover film in which the aforementioned defects do not occur when a protective film stacked on a window cover film is peeled off by endowing the window cover film with antistatic characteristics by which static electricity occurring on the window cover film is prevented.

Another embodiment of the present invention is directed to providing a polyimide-based film for a window cover film, which has excellent physical and chemical properties such as high transparency, wear resistance, chemical resistance, and the like while endowing antistatic characteristics.

Still another embodiment of the present invention is directed to providing an antistatic polyimide-based film for a window cover as a window cover film for protecting a display panel, in which problems, such as defects caused because a portion of a protective film remains on an optical film for a window cover when a protective film for protecting the window cover film is peeled off, are reduced.

Yet another embodiment of the present invention is directed to providing a flexible display panel including an antistatic polyimide-based film for window cover in which the peeling-off of the protective film is remarkably improved.

In a general aspect, an antistatic polyimide-based film is provided, which includes a polyimide-based base layer, and an antistatic layer formed on one or both surfaces of the base layer and having a surface resistance of $10^7 \Omega/\square$ or more, wherein the antistatic polyimide-based film has a total light transmittance of 89% or more, a haze of 1.2% or less, a yellow index of 3.0 or less, and a b* value of 1.5 or less.

In a general aspect of the present invention, the antistatic polyimide-based film may have a surface resistance change of $1 \times 10^3$ or less, as measured according to the following Equation 1, after being maintained at 150° C. for 10 minutes.

Surface Resistance Change=Surface Resistance after Heat Treatment/Surface Resistance before Heat Treatment [Equation 1]

In a general aspect of the present invention, the antistatic layer may include modified carbon nanotubes surface-treated with an inorganic acid, and an organic-inorganic binder resin.

In a general aspect of the present invention, the antistatic layer may include 0.01 to 5 parts by weight of the modified carbon nanotubes surface-treated with the inorganic acid, based on 100 parts by weight of the organic-inorganic binder resin.

In a general aspect of the present invention, the organic-inorganic binder resin may be derived from any one or two or more inorganic precursors selected from tetraalkoxysilane, trialkoxysilane, dialkoxysilane, monoalkoxysilane, and colloid silica; and any one or two or more silane coupling agents selected from vinyl trichlorosilane, vinyltris(β-methoxyethoxy)silane, vinyl triethoxysilane, vinyl trimethoxysilane, 3-methacryloxypropyl-trimethoxysilane, β-(3,4-epoxycyclohexyl)-ethyltrimethoxysilane, γ-glycidoxypropyl-trimethoxysilane, glycidoxypropyl-trimethoxysilane, γ-glycidoxypropyl-methylidiethoxysilane,N-β-(aminoethyl)-γ-aminopropyl-trimethoxysilane, N-β-(aminoethyl)-γ-aminopropyl-methyl-dimethoxysilane, 3-aminopropyl-triethoxysilane, N-phenyl-γ-aminopropyl-trimethoxysilane, and γ-mercaptopropyl-trimethoxysilane.

In a general aspect of the present invention, the base layer may have a modulus of 3 GPa or more and a break elongation of 8% or more, as measured according to ASTM D882, have a light transmittance of 5% or more, as measured at 388 nm according to ASTM D1746, and have a total light transmittance of 87% or more, as measured at 400 to 700 nm, a haze of 2.0% or less, a yellow index of 5.0 or less, and a b* value of 2.0 or less.

In a general aspect of the present invention, the base layer may have a polyamide-imide structure.

In a general aspect of the present invention, the base layer may include a unit derived from a fluorine-based aromatic diamine, a unit derived from an aromatic dianhydride, a unit derived from an alicyclic dianhydride, and a unit derived from an aromatic diacid dichloride. In a general aspect of the present invention, the base layer may have a thickness of 10 to 500 μm, and the antistatic layer may have a thickness of 1 nm to 1 μm.

In another general aspect, a window cover film is provided, which includes the antistatic polyimide-based film as described above; and a coating layer formed between a base layer and an antistatic layer of the antistatic polyimide-based film or formed on a back surface of the antistatic layer or the antistatic layer.

In a general aspect of the present invention, the coating layer may include any one or more selected from a hard coating layer, an anti-fingerprint layer, an anti-fouling layer, an anti-scratch layer, a low-refractive index layer, an anti-reflective layer, and an impact absorption layer. In still another general aspect, a flexible display panel including the antistatic polyimide-based film as described above is provided.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EMBODIMENTS

Hereinafter, the present invention will be described in further detail with reference to embodiments or examples thereof, which include the accompanying drawings. However, it should be understood that the following embodiments or examples are only illustrative to describe the present invention in detail, and the present invention is not limited thereto and may be implemented in various forms.

Also, unless defined otherwise, all technical and scientific terms used herein have the same meanings as commonly understood by one skilled in the art to which the present disclosure pertains.

Terms used for description in the present invention are intended to effectively describe particular embodiments or examples, but are not intended to limit the present invention.

In addition, singular forms used in the specification and the appended claims are intended to include plural forms as well, unless otherwise specified in the context.

Further, throughout the specification describing the present invention, a certain part "including" a certain element signifies that the certain part may be further inclusive, instead of exclusive, of another element unless particularly indicated otherwise.

In the present invention, the meaning of a polyimide-based resin includes a polyimide resin and a polyamide-imide resin.

The present inventors have conducted extensive research to solve a problem such as poor peeling-off caused during the peeling-off a protective film due to static electricity when a plastic film such as a polyimide-based film is used in a window cover film for a display panel.

As a result, the present inventors may solve the above problem by forming an antistatic layer, which satisfies certain requirements, on one surface of the window cover film.

That is, in the present invention, the above problem may be solved by forming an antistatic layer, which has a surface resistance of $10^7 \Omega/\square$ or more, and more specifically in a range of $10^7$ to $10^{13} \Omega/\square$, on one surface of the window cover film, for example, one surface of a polyimide-based base layer without particularly changing optical characteristics of the polyimide-based film, for example, optical characteristics such as light transmittance, yellow index, and the like.

Hereinafter, specific aspects of the present invention will be described with reference to the drawings. In this case, an aspect of the present invention is not limited as long as it is a window cover film for a window cover of a flexible display panel, which has an antistatic layer formed on any one or both surfaces of the polyimide-based base layer.

Figure 1:
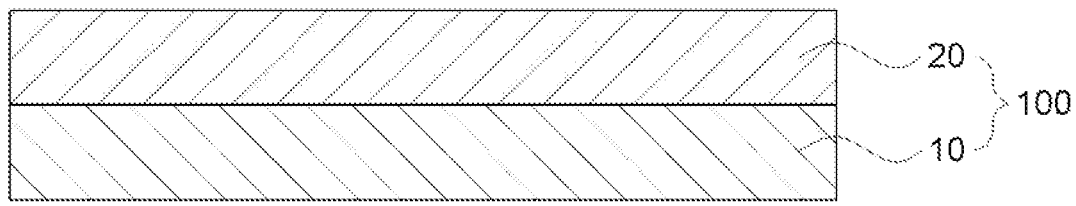
FIG. 1 shows a first aspect of an antistatic polyimide-based film according to the present invention.

FIG. 1 shows a first aspect of an antistatic polyimide-based film according to the present invention. As shown in FIG. 1, an antistatic layer 20 may be formed on one surface of a polyimide-based base layer 10.

Figure 2:
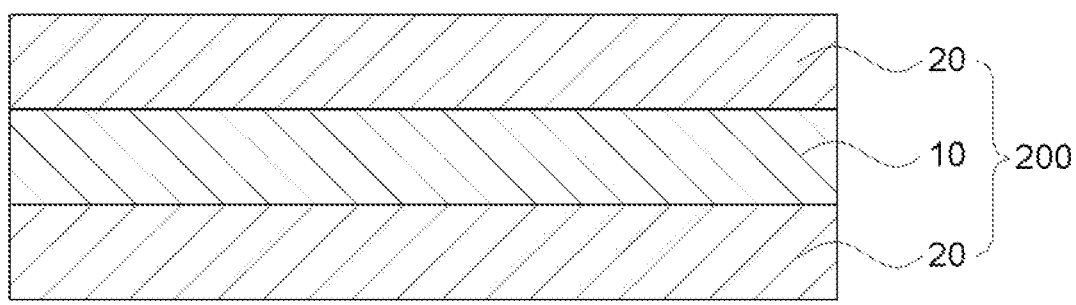
FIG. 2 shows a second aspect of the antistatic polyimide-based film according to the present invention.

FIG. 2 shows a second aspect of an antistatic polyimide-based film according to the present invention. As shown in FIG. 2, the antistatic layers 20 may be formed on both surfaces of the polyimide-based base layer 10.

Figure 3:
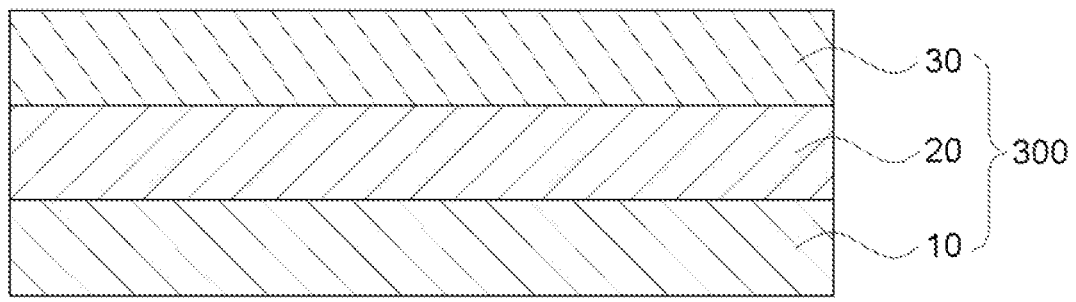
FIG. 3 shows a third aspect of the antistatic polyimide-based film according to the present invention.

FIG. 3 shows a third aspect of an antistatic polyimide-based film according to the present invention. As shown in FIG. 3, the antistatic layer 20 may be formed on one surface of the polyimide-based base layer 10, and a hard coating layer 30 may be formed on a back surface of the polyimide-based base layer 10.

Figure 4:
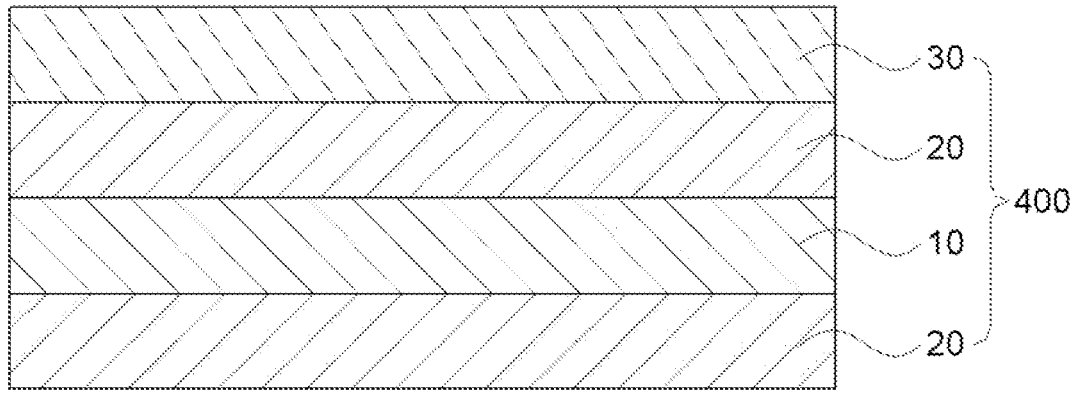
FIG. 4 shows a fourth aspect of the antistatic polyimide-based film according to the present invention.

FIG. 4 shows a fourth aspect of an antistatic polyimide-based film according to the present invention. As shown in FIG. 4, the antistatic layers 20 may be formed on both surfaces of the polyimide-based base layer 10, and the hard coating layer 30 may be formed on any one surface of the antistatic layer 20.

Also, although not shown, any one aspect selected from FIGS. 1 to 4, any one or more coating layers, which are selected from a hard coating layer, an anti-fingerprint layer, an anti-fouling layer, an anti-scratch layer, a low-refractive index layer, an anti-reflective layer, an impact absorption layer, and the like, may be further included between the base layer and the antistatic layer, or included on a back surface of the antistatic layer or the antistatic layer.

FIGS. 1 to 4 more specifically show stacked configurations of the antistatic polyimide-based film according to the present invention, but the antistatic polyimide-based film of the present invention is not limited thereto.

The antistatic polyimide-based film of the present invention shown in FIGS. 1 and 2 may satisfy properties such as a total light transmittance of 89% or more, a haze of 1.2% or less, a yellow index of 3.0 or less, and a b* value of 1.5 or less at the same time. That is, although the antistatic layer is formed as described above, the base layer may have excellent optical properties.

Also, the antistatic polyimide-based film may have a surface resistance change of $1\times10^3$ or less, that is, 3 orders of magnitude or less, and more desirably 2 orders of magnitude or less, as measured according to the following Equation 1 after maintained at 150° C. for 10 minutes. For example, a change in surface resistance of 3 orders of magnitude or less means that the surface resistance after heat treatment is in a range of $1\times10^9$ to $1\times10^{12}\Omega/\square$ or $1\times10^{10}$ to $1\times10^{12}\Omega/\square$ when the surface resistance before heat treatment is $1\times10^9\Omega/\square$.

Surface Resistance Change=Surface Resistance after Heat Treatment/Surface Resistance before Heat Treatment [Equation 1]

Within this range, it is desirable because a film having a small change in antistatic characteristics may be provided even when the heat treatment is performed at a high temperature in subsequent processes such as formation of the hard coating layer, and the like. The present invention may satisfy the properties such as a surface resistance change of 3 orders of magnitude or less, as described above, because modified carbon nanotubes surface-treated with an inorganic acid, and an organic-inorganic binder resin as a matrix binder are used in the antistatic layer. Hereinafter, a configuration of each layer will be described in further detail with reference to FIGS. 1 to 4.

<Polyimide-Based Base Layer>

First, the base layer of the present invention has excellent optical properties and mechanical properties, and thus may be composed of a material having an elastic force and a restoring force.

The base layer may be in a single-layer structure, and may be in a multi-layered structure in which two or more layers are stacked. Specifically, the base layer may be stacked on a surface of a base film, which includes an optical layer.

In an aspect of the present invention, the base layer may have a thickness of 10 to 500 µm, 20 to 250 µm, or 30 to 100 µm. When the base layer has a thickness as described above, it is desirable because mechanical properties may be satisfied, and a light distortion phenomenon may also be lowered.

In an aspect of the present invention, the base layer may have a modulus of 3 GPa or more, 4 GPa or more, or 5 GPa or more, and a break elongation of 8% or more, 12% or more, or 15% or more, as measured according to ASTM D882, may have a light transmittance of 5% or more, or 5% to 80%, as measured at 388 nm according to ASTM D1746, and a total light transmittance of 87% or more, 88% or more, or 89% or more, as measured at 400 to 700 nm, may have a haze of 2.0% or less, 1.5% or less, or 1.0% or less, as measured according to ASTM D1003, and may have a yellow index of 5.0 or less, 3.0 or less, or 0.4 to 3.0 and a b* value of 2.0 or less, 1.3 or less, or 0.4 to 1.3, as measured according to ASTM E313.

In an aspect of the present invention, the base layer is a polyimide-based resin. In particular, when the base layer is a polyimide-based resin having a polyamide-imide structure, it is more desirable because the properties may be sufficiently satisfied.

More desirably, the base layer may be a polyamide-imide-based resin including a fluorine atom and an aliphatic cyclic structure. Therefore, it is more preferred because the base layer may have excellent characteristics such as mechanical properties and dynamic bending characteristics.

As a more specific example, the base layer may include a polyamide-imide-based resin derived from a fluorine-based aromatic diamine, an aromatic dianhydride, an alicyclic dianhydride, and an aromatic diacid dichloride.

In an aspect of the present invention, when one example of the polyamide-imide-based resin including the fluorine atom and the aliphatic cyclic structure is a polyamide-imide polymer manufactured by manufacturing an amine-terminated polyamide oligomer derived from a first fluorine-based aromatic diamine and an aromatic diacid dichloride, polymerizing the amine-terminated polyamide oligomer, a second fluorine-based aromatic diamine, an aromatic dianhydride, and an alicyclic dianhydride, and imidizing the polymerized product, the polyamide-imide-based resin is most preferred because the purpose of the present invention may be achieved more easily. The same or different types of fluorine-based aromatic diamines may be used as the first fluorine-based aromatic diamine and the second fluorine-based aromatic diamine.

In an aspect of the present invention, as described above, when an amine-terminated oligomer in which an amide structure in a polymer chain is formed by the aromatic diacid dichloride is included as a diamine monomer, the optical properties may be improved, and mechanical strength (including a modulus) may also be improved. Also, the dynamic bending characteristics may be further improved.

In an aspect of the present invention, when the base layer has a fluorine-substituted polyamide oligomer block as described above, the diamine monomer including the amine-terminated fluorine-substituted polyoligomer and the second fluorine-based aromatic diamine and the dianhydride monomer including the aromatic dianhydride and the alicyclic dianhydride according to the present invention may be used at a molar ratio of 1:0.8 to 1.1, desirably a molar ratio of 1:0.9 to 1. Also, a content of the amine-terminated polyamide oligomer is not particularly limited, but the amine-terminated polyamide oligomer is included at a content of 30 mol % or more, desirably 50 mol % or more, and more desirably 70 mol % or more, based on the total weight of the diamine monomer. Therefore, it is more desirable to satisfy the mechanical properties, the yellow index, and the optical characteristics according to the present invention. Also, a composition ratio of the aromatic dianhydride and the alicyclic dianhydride is not particularly limited, but the aromatic dianhydride and the alicyclic dianhydride are desirably used at a ratio of 30 to 80 mol %:70 to 20 mol % in consideration of achieving the transparency, the yellow index, the mechanical properties, and the like according to the present invention, but the present invention is not limited thereto.

Also, in the present invention, another example of the polyamide-imide-based resin including the fluorine atom and the aliphatic cyclic structure may be a polyamide-imide-based resin obtained by mixing a fluorine-based aromatic diamine, an aromatic dianhydride, an alicyclic dianhydride, and an aromatic diacid dichloride and subjecting the resulting mixture to polymerization and imidization. Such a resin has a random copolymer structure, and thus the aromatic diacid dichloride may be used at 40 moles or more, preferably 50 to 80 moles, based on 100 moles of the diamine. In this case, a content of the aromatic dianhydride may be in a range of 10 to 50 moles, and a content of the alicyclic dianhydride may be in a range of 10 to 60 moles. Here, the polyamide-imide-based resin is manufactured by polymerizing the sum of the diacid dichloride and the dianhydride at a molar ratio of 1:0.8 to 1.1, based on the diamine monomer. Desirably, the diacid dichloride and the dianhydride are polymerized at a molar ratio of 1:0.9 to 1. The random polyamide-imide of the present invention has somewhat different optical characteristics (such as transparency, and the like), mechanical properties, and the like compared to the aforementioned block-type polyamide-imide resin, but this difference may also fall within the scope of the present invention.

In an aspect of the present invention, examples of the fluorine-based aromatic diamine component include monomers such as 2,2'-bis(trifluoromethyl)-benzidine, and the like. Also, a mixture of such a fluorine-based aromatic diamine and other known aromatic diamine components may also be used, which falls within the scope of the present invention. For example, the 2,2'-bis(trifluoromethyl)-benzidine may be used alone. As such, the use of the fluorine-based aromatic diamine may enhance the optical characteristics of the polyimide-imide-based film, and may improve the yellow index. Also, the tensile modulus of the polyamide-imide-based film may be improved to improve the mechanical strength of the hard coating film, and further improve the dynamic bending characteristics.

At least one or a mixture of two or more selected from a 4,4'-hexafluoroisopropylidene diphthalic anhydride (6FDA) and a biphenyltetracarboxylic dianhydride (BPDA), an oxydiphthalic dianhydride (ODPA), a sulfonyl diphthalic anhydride (SO2DPA), a (isopropylidenediphenoxy) bis(phthalic anhydride) (6HDBA), a 4-(2,5-dioxotetrahydrofuran-3-yl)-1,2,3,4-tetrahydronaphthalene-1,2-dicarboxylic dianhydride (TDA), a 1,2,4,5-benzene tetracarboxylic dianhydride (PMDA), a benzophenone tetracarboxylic dianhydride (BTDA), a bis(carboxyphenyl) dimethyl silane dianhydride (SiDA), and a bis(dicarboxyphenoxy) diphenyl sulfide dianhydride (BDSDA) may be used as the aromatic dianhydride, but the present invention is not limited thereto.

Any one or a mixture of two or more selected from the group consisting of 1,2,3,4-cyclobutanetetracarboxylic dianhydride (CBDA), 5-(2,5-dioxotetrahydrofuryl)-3-methylcyclohexene-1,2-dicarboxylic dianhydride(DOCDA), bycyclo[2.2.2]oct-7-ene-2,3,5,6-tetracarboxylic dianhydride(BTA), bicyclooctene-2,3,5,6-tetracarboxylic dianhydride(BODA), 1,2,3,4-cyclopentanetetracarboxylic dianhydride (CPDA), 1,2,4,5-cyclohexanetetracarboxylic dianhydride (CHDA), 1,2,4-tricarboxy-3-methylcarboxycyclopentane dianhydride (TMDA), 1,2,3,4-tetracarboxycyclopentane dianhydride (TCDA), and derivatives thereof may be used as one example of the alicyclic dianhydride.

In an aspect of the present invention, when an amide structure is formed in a polymer chain by the aromatic diacid dichloride, the optical properties may be enhanced, and mechanical strength (including a modulus) may also be greatly improved. Also, the dynamic bending characteristics may be further improved.

A mixture of two or more selected from the group consisting of isophthaloyl dichloride (IPC), terephthaloyl dichloride (TPC), [1,1'-biphenyl]-4,4'-dicarbonyl dichloride (BPC), 1,4-naphthalene dicarboxylic dichloride (NPC), 2,6-naphthalene dicarboxylic dichloride (NTC), 1,5-naphthalene dicarboxylic dichloride (NEC), and derivatives thereof may be used as the aromatic diacid dichloride, but the present invention is not limited thereto.

In the present invention, a weight average molecular weight of the polyimide resin is not particularly limited, but the polyimide resin may have a weight average molecular weight of 200,000 g/mol or more, desirably 300,000 g/mol or more, and more desirably 200,000 to 500,000 g/mol. Also, a glass transition temperature of the polyimide resin is not particularly limited, but the polyimide resin may have a glass transition temperature of 300 to 400° C., more specifically 330 to 380° C. Within this range, the polyimide resin may be preferred because a film having high modulus, high mechanical strength, and excellent optical properties, and showing low curl occurrence may be provided, but the present invention is not limited thereto.

Hereinafter, a method of manufacturing a base layer will be described.

In an aspect of the present invention, the base layer may be manufactured by applying a "polyimide-based resin solution," which includes a polyimide-based resin and a solvent, onto a base, followed by drying or drying and elongation. That is, the base layer may be manufactured by a solution casting method.

By way of example, the base layer may be manufactured by a method including reacting a fluorine-based aromatic diamine and an aromatic diacid dichloride to manufacture an oligomer (an amine-terminated oligomer-manufacturing step), reacting a fluorine-based aromatic diamine, an aromatic dianhydride, and an alicyclic dianhydride with the manufactured oligomer to manufacture a polyamic acid solution, imidizing the polyamic acid solution to manufacture a polyamide-imide resin, and applying a polyamide-imide solution dissolved in an organic solvent onto the polyamide-imide resin to form a film.

Hereinafter, one example in which a block-type polyamide-imide film is manufactured will be described in further detail with reference to steps thereof.

The manufacturing of the oligomer may include reacting a fluorine-based aromatic diamine and an aromatic diacid dichloride in a reactor, and purifying and drying the obtained oligomer. In this case, the content of fluorine-based aromatic diamine is added in a molar ratio of 1.01 to 2 with respect to the aromatic diacid dichloride to manufacture an amine-terminated polyamide oligomeric monomer. A molecular weight of the oligomeric monomer is not particularly limited, but superior properties may be realized, for example, when the weight average molecular weight is in a range of 1,000 to 3,000 g/mol.

Also, it is desirable to use an aromatic carbonyl halide monomer such as terephthaloyl chloride, isophthaloyl chloride, or the like rather than terephthalic acid ester or terephthalic acid itself in order to introduce an amide structure. This is not obvious, but a chlorine element appears to affect the properties of a film.

Next, the manufacturing of the polyamic acid solution may be carried out by means of a solution polymerization reaction in which a fluorine-based aromatic diamine, an aromatic dianhydride, and an alicyclic dianhydride are reacted with the manufactured amine-terminated fluorine-based fluorine-substituted polyamide oligomer in an organic solvent. In this case, the organic solvent used for the polymerization reaction may, for example, include any one or two or more polar solvents selected from dimethylacetamide (DMAc), N-methyl-2-pyrrolidone (NMP), dimethylformamide (DMF), dimethylformsulfoxide (DMSO), ethyl cellosolve, methyl cellosolve, acetone, diethylacetate, m-cresol, and the like.

Then, the manufacturing of the polyamide-imide resin by imidization may be performed by chemical imidization. More preferably, the polyamic acid solution is more desirably chemically imidized using pyridine and an acetic anhydride. Then, the polyamic acid solution may be imidized at a low temperature of 150° C. or less, desirably 100° C. or less, and specifically 50 to 150° C. using an imidization catalyst and a dehydrating agent.

By means of such a method, the entire film may be endowed with regular mechanical properties, compared to an imidization reaction using heat at a high temperature.

Any one or two or more selected from pyridine, isoquinoline, and β-quinoline may be used as the imidization catalyst. Also, any one or two or more selected from an acetic anhydride, a phthalic anhydride, and a maleic anhydride may be used as the dehydrating agent, but the present invention is not particularly limited thereto.

Also, the polyamide-imide resin may be manufactured by mixing an additive, such as a flame retardant, an adhesion promoter, inorganic particles, an antioxidant, a sunscreen agent, a plasticizer, and the like, with the polyamic acid solution.

Also, after the imidization is performed, the resin may be purified using a solvent to obtain solid contents, and the solid contents may be dissolved in a solvent to obtain a polyamide-imide solution. The solvent may, for example, include N,N-dimethylacetamide (DMAc), and the like, but the present invention is not limited thereto.

The applying of the polyamide-imide solution to form a film is performed by applying the polyamide-imide solution on a substrate, and drying the polyamide-imide solution in a drying stage divided into a drying region. Also, elongation may be performed before and after drying, when necessary. A heat treatment step may be further performed after the drying or elongation step. Glass, stainless steel, or a film may be, for example, used as the substrate, but the present invention is not limited thereto. The application may be performed using a die coater, an air knife, a reverse roll, a spray, a blade, casting, gravure, spin coating, and the like.

<Antistatic Layer>

Next, the antistatic layer of the present invention will be described in detail.

In an aspect of the present invention, the antistatic layer may be disposed on at least one surface of the base layer. The antistatic layer may prevent the occurrence of static electricity occurring on the polyimide-based film to prevent an abnormal increase in adhesive force between the protective film and the base layer caused by the static electricity. Therefore, delamination of adhesive sides between respective layers of the window cover film, which may occur during processes such as peeling-off of the protective film, may be prevented. Also, a phenomenon in which degradation of the optical properties is caused during a process because an adhesive of the protective film remains on the base layer or various adherends, which leads to defects, may be solved.

Also, the antistatic layer has excellent high-temperature stability, and thus may also retain a characteristic of proving a film having a small change in surface resistance even when a high-temperature treatment process such as a subsequent process, and the like is required.

In an aspect of the present invention, the antistatic layer may have a surface resistance of $10^7 \Omega/\square$ or more, specifically $10^7$ to $10^{13}\Omega/\square$, and more specifically $10^8$ to $10^{12}\Omega/\square$. Within a range satisfying this range, a poor peeling-off phenomenon in which an optically clear adhesive layer such as an optically clear adhesive (OCA) or an optically clear resin (OCR), which is stacked on the window cover film, is peeled off in the step of peeling off and removing the protective film may be prevented due to a change in adhesive force of the protective film caused due to the static electricity. Also, only the protective film may be easily peeled off without having any influence on the other layers. Also, the antistatic layer may have an effect of preventing the adhesive component of the protective film from remaining on an adherend object.

Also, in an aspect of the present invention, the antistatic polyimide-based film on which the antistatic layer is formed may have a surface resistance change of 3 orders of magnitude or less, and more desirably 2 orders of magnitude or less, when the surface resistance is measured according to the following Equation 1 after being kept at 150° C. for 10 minutes.

For example, a change in surface resistance of 3 orders of magnitude or less means that the surface resistance after heat treatment is in a range of $10^9$ to $10^{12}\Omega/\square$ when the surface resistance before heat treatment is $10^9\Omega/\square$. Within this range, it is desirable because a film having a small change in antistatic characteristics can be provided and the various problems, as described above, which have actually occurred in the prior art in a process of peeling-off of the protective film may be solved even when the heat treatment is performed at a high temperature in subsequent processes such as formation of the hard coating layer, and the like. The present invention may satisfy the properties such as a surface resistance change of 3 orders of magnitude or less, as described above, because the modified carbon nanotubes surface-treated with an inorganic acid, and an organic-inorganic binder resin as a matrix binder are used in the antistatic layer. Also, it is desirable because the loss of the mechanical and optical properties may be minimized.

Surface Resistance Change=Surface Resistance after Heat Treatment/Surface Resistance before Heat Treatment [Equation 1]

In an aspect of the present invention, the antistatic layer may have a thickness of 1 nm to 1 μm, more specifically 30 to 700 nm, and more specifically 50 to 500 nm. Within this range, it is suitable for expressing the antistatic characteristics, (for example), to a desired extent solving poor peeling-off without increasing the entire thickness of the film.

In an aspect of the present invention, the antistatic layer includes modified carbon nanotubes surface-treated with an inorganic acid, and an organic-inorganic binder resin. When the antistatic layer includes the modified carbon nanotubes surface-treated with the inorganic acid, the properties such as a surface resistance of $10^7\Omega/\square$ or more may be achieved even when the modified carbon nanotubes are used at a small content, and the organic-inorganic binder resin may be uniformly dispersed. Therefore, the antistatic layer has excellent antistatic characteristics, and excellent optical characteristics of the base layer may not be damaged.

In an aspect, a content of the modified carbon nanotubes surface-treated with the inorganic acid is not particularly limited, but when the antistatic layer, for example, includes 0.01 to 5 parts by weight, desirably 0.1 to 3 parts by weight of the modified carbon nanotubes surface-treated with the inorganic acid, based on 100 parts by weight of the organic-inorganic binder resin, it is more desirable because the optical characteristics or the mechanical characteristics of the window cover film may not be hindered, and only the antistatic characteristics may be more desirably exerted, thereby solving a problem of poor peeling-off upon the peeling-off of the protective film.

The modified carbon nanotubes surface-treated with the inorganic acid according to the present invention may be single-walled or multi-walled carbon nanotubes, and may have a length of 1 μm to 50 μm and an average diameter of 1 nm to 100 nm. Within this range, it is desirable because the modified carbon nanotubes may have excellent dispersibility without any large increase in thickness of the antistatic layer, but the present invention is not limited thereto.

Hereinafter, a method of forming an antistatic layer will be described in detail. However, it should be understood that the method described hereinafter is merely illustrative of the present invention, but is not intended to limit the present invention.

In an aspect, the antistatic layer may be formed by coating an antistatic coating composition, which includes modified carbon nanotubes surface-treated with an inorganic acid, an organic-inorganic binder resin serving as a matrix binder, and a solvent, onto a base layer, and drying the base layer.

More specifically, the antistatic coating composition includes a modified carbon nanotube dispersion obtained by dispersing the modified carbon nanotubes surface-treated with the inorganic acid in an alcohol-based solvent; an organic-inorganic binder resin solution including an inorganic precursor, a silane coupling agent, and a cosolvent; and an initiator, and their solid contents may, for example, be in a range of 0.1 to 5% by weight. However, the solid contents of the present invention are not limited to this range.

In an aspect, the antistatic coating composition may include 0.1 to 5 parts by weight of the modified carbon nanotubes and 0.1 to 5 parts by weight of the initiator, based on 100 parts by weight of the organic-inorganic binder resin solution. More specifically, the antistatic coating composition may include 0.5 to 3 parts by weight of the modified carbon nanotubes and 0.5 to 3 parts by weight of the initiator, based on 100 parts by weight of the organic-inorganic binder resin solution. Within this range, it is more desirable because the optical characteristics or mechanical characteristics of the antistatic polyimide-based film may not be hindered, and, more desirably, only the antistatic characteristics may be exerted to solve a problem such as poor peeling-off during the peeling-off of the protective film.

The modified carbon nanotubes surface-treated with the inorganic acid may be manufactured by treating common single-walled or multi-walled carbon nanotubes with an inorganic acid solution and drying the carbon nanotubes.

For example, a method of manufacturing nitric acid-treated multi-walled carbon nanotubes according to an embodiment may be performed by mixing nitric acid with water, heating the resulting mixture at 40 to 100° C. for a certain period of time, washing the mixture with deionized water, and drying the mixture. In general, 50 to 300 parts by weight of water may be mixed relative to 100 parts by weight of nitric acid, but the present invention is not limited thereto. A functional group may be formed on surfaces of the carbon nanotubes by means of the nitric acid treatment, and thus may bind to the organic-inorganic binder, thereby inducing optical characteristics and a dispersion effect.

In an aspect of the present invention, a modification time with nitric acid may be in a range of 30 minutes to 10 hours, but the present invention is not limited thereto. In the case of the treatment time, when the modification time is greater than or equal to approximately 4 hours, there is no significant difference in an effect of modifying a surface functional group. Therefore, it is desirable to treat the carbon nanotubes for about 4 hours. It can be seen that the functional group generated on the surfaces of the carbon nanotubes by means of the treatment is an oxidized functional group such as a hydroxyl group, a carboxyl group, a carbonyl group, or the like. As such, even when the carbon nanotubes surface-treated with the inorganic acid are used at a small amount, sufficient specific surface resistance may be achieved, and a dispersion effect may also be good, and thus transparency, or uniformity in transparency of the surface of the carbon nanotubes may not be hindered.

The carbon nanotubes surface-modified with the inorganic acid may be used in a composition in the form of a dispersion in which the carbon nanotubes are dispersed in a solvent. As such, modified carbon nanotube dispersion is manufactured by dispersing the modified carbon nanotubes surface-treated with the inorganic acid in a solvent such as an alcohol-based solvent, more specifically isopropyl alcohol, and the like. More desirably, it is more preferred because the carbon nanotubes may be dispersed using ultrasonic waves, and the like, resulting in further improved dispersibility. Also, the modified carbon nanotube dispersion may be obtained by dispersing the modified carbon nanotubes surface-treated with the inorganic acid is a solvent such as an alcohol-based solvent, more specifically isopropyl alcohol, and the like such that the solid content of the modified carbon nanotubes is in a range of 0.1 to 5% by weight. Within this solid content, it is preferred because the dispersibility of the modified carbon nanotubes may be further improved, and a high-transmittance film may be provided without hindering the transmittance of the base layer itself during formation of the antistatic layer.

Next, an organic-inorganic binder that is the matrix binder according to the present invention will be described. More specifically, the organic-inorganic binder may be included in a composition in the form of an organic-inorganic binder resin solution.

The inorganic precursor may include any one or two or more selected from tetraalkoxysilane, trialkoxysilane, dialkoxysilane, monoalkoxysilane, colloid silica, and the like. The silane coupling agent may include any one or a mixture of two or more selected from vinyl trichlorosilane, vinyltris(β-methoxyethoxy)silane, vinyl triethoxysilane, vinyl trimethoxysilane, 3-methacryloxypropyl-trimethoxysilane (MPTMS), β-(3,4-epoxycyclohexyl)-ethyltrimethoxysilane, γ-glycidoxypropyl-trimethoxysilane, glycidoxypropyl-trimethoxysilane, γ-glycidoxypropyl-methylidiethoxysilane, N-β-(aminoethyl)-γ-aminopropyl-trimethoxysilane, N-β-(aminoethyl)-γ-aminopropyl-methyldimethoxysilane, 3-aminopropyl-triethoxysilane, N-phenyl-γ-aminopropyl-trimethoxysilane, γ-mercaptopropyl-trimethoxysilane, and the like. However, when the silane coupling agent has a reactive group and also has a siloxane group, the components are not particularly limited but preferred.

The cosolvent may be any one or a mixture of two or more selected from toluene, isopropyl alcohol, ethylacetate, ethyl cellosolve, and the like.

More specifically, according to an embodiment, the organic-inorganic binder resin solution may be manufactured by adding 20 to 30% by weight of water, 0.1 to 3% by weight of an acidic catalyst, and 20 to 30% by weight of a cosolvent (a mixed solvent of toluene, isopropyl alcohol, ethylacetate, and ethyl cellosolve), based on the weight of a silane compound in which tetraalkoxysilane (TEOS) and 3-methacryloxypropyl-trimethoxysilane (MPTMS) are mixed at a weight ratio of 7 to 9:3 to 1, and stirring and reacting the resulting mixture at room temperature.

A thermal initiator may be used as the initiator. Specifically, the initiator may, for example, include any one selected from the group consisting of platinum, rhodium, iridium, palladium, and ruthenium, but the present invention is not limited thereto. For example, the metal catalyst may include platinum(0)-1,3-divinyl-1,1,3,3-tetramethyldisiloxane, platinum-cyclovinylmethylsiloxane, and tris(dibutylsulfide)trichloride, but the present invention is not limited thereto. In general, the initiator is preferably blended at a content of approximately 1 ppm to approximately 200 ppm, based on the weight of the organic oligosiloxane component. More specifically, the organic-inorganic binder resin solution may be manufactured by stirring an inorganic precursor, a silane coupling agent, a catalyst, and a cosolvent at room temperature and reacting the resulting mixture. More specifically, the organic-inorganic binder resin solution may be manufactured by stirring the mixture at room temperature (20 to 30° C.) for 1 to 10 hours.

In this case, the inorganic precursor and the silane coupling agent may be used so that a weight ratio of the inorganic precursor and the silane coupling agent is in a range of 1:9 to 9:1, more specifically in a range of 2:8 to 8:2. Also, 20 to 30% by weight of water, 0.1 to 3% by weight of the acidic catalyst, and 20 to 30% by weight of the cosolvent may be added based on the sum of the weights of the silane compounds mixed at the ratio as described above, and reacted at room temperature.

An inorganic acid such as hydrochloric acid, nitric acid, sulfuric acid, phosphoric acid, and the like, and an organic acid such as acetic acid, oxalic acid, and the like may be used as the acidic catalyst. Preferably, hydrochloric acid is used. The acidic catalyst is preferably added so that a reaction solution is maintained under a condition of pH 0.5 to 2.5.

In an aspect of the present invention, when the organic-inorganic binder resin is used as the matrix binder, the dispersion stability of the modified carbon nanotubes surface-treated with the inorganic acid may be maintained, and the modified carbon nanotubes may also be endowed with an anti-reflection effect due to a low refractive index thereof. Therefore, it is desirable because the optical characteristics such as transmittance are not hindered.

The antistatic layer is manufactured by coating, drying, and curing the antistatic coating composition. In this case, a conventional method such as bar coating, flow coating, spray coating, and the like may be used as the coating method, and a description thereof is not described any more in the present invention.

<Window Cover Film>

A window cover film of the present invention is not limited as long as the window cover film includes the antistatic layer in the base layer.

According to an aspect of the present invention, examples of such a window cover film include a window cover film including the antistatic polyimide-based film on which the aforementioned antistatic layer is formed; and a coating layer formed between the polyimide-based film and the antistatic layer or formed on the antistatic layer.

According to an aspect of the present invention, the coating layer is a layer for endowing the window cover film with functionality, and thus may be variously applied according to a purpose.

As a specific example, the coating layer may include any one or more layers selected from a hard coating layer, a restoration layer, an impact spreading layer, a self-cleaning layer, an anti-fingerprint layer, an anti-scratch layer, a low-refractive index layer, an impact absorption layer, and the like, but the present invention is not limited thereto.

The coating layer may be formed in various manners because the coating layer may be formed between the base layer and the antistatic layer of the polyimide-based film, formed on the base layer on which the antistatic layer is not formed, or formed on the antistatic layer.

Although the various coating layers are formed on the polyimide-based film as described above, a window cover film, which has excellent display quality and high optical characteristics, and, particularly, has a remarkably reduced rainbow effect, may be provided.

The coating layer itself is adopted to endow functions, and also may protect the polyimide-based film having excellent optical and mechanical characteristics from external physical or chemical damages.

According to an aspect of the present invention, the coating layer may be formed so that a solid content of the coating layer is in a range of 0.01 to 200 $g/mm^2$, based on the total area of the polyimide-based film. Preferably, the coating layer may be formed so that a solid content of the coating layer is in a range of 20 to 200 $g/mm^2$, based on the total area of the polyimide-based film. When the coating layer is provided at a basic content as described above, a surprisingly severe rainbow effect may not be caused while maintaining functionality, which makes it possible to achieve excellent visibility.

According to an aspect of the present invention, the coating layer may be particularly formed by application in a state of a composition for forming a coating layer, which includes a coating solvent. The coating solvent is not particularly limited, but may be preferably a polar solvent. For example, the polar solvent may include any one or more solvents selected from an ether-based solvent, a ketone-based solvent, an alcohol-based solvent, an amide-based solvent, a sulfoxide-based solvent, an aromatic hydrocarbon-based solvent, and the like. Specifically, the polar solvent may include any one or more solvents selected from dimethylacetamide (DMAc), N-methyl-2-pyrrolidone (NMP), dimethylformamide (DMF), dimethylsulfoxide (DMSO), acetone, ethylacetate, propylene glycol methyl ether, m-cresol, methanol, ethanol, isopropanol, butanol, 2-methoxyethanol, methyl cellosolve, ethyl cellosolve, methyl ethyl ketone, methyl butyl ketone, methyl isobutyl ketone, methyl phenyl ketone, diethyl ketone, dipropyl ketone, cyclohexanone, hexane, heptane, octane, benzene, toluene, xylene, and the like.

According to an aspect of the present invention, the coating layer may be formed using a method of applying a composition for forming a coating layer onto the polyimide-based base layer or the antistatic layer. For example, any one or more methods selected from a spin coating method, a dipping method, a spraying method, a die coating method, a bar coating method, a roll coating method, a meniscus coating method, a flexographic printing method, a screen printing method, a bead coating method, an air-knife coating method, a reverse roll coating method, a blade coating method, a cast coating method, a gravure coating method, and the like may be used, but the present invention is not limited thereto.

Preferably, according to an aspect of the present invention, the coating layer may be a hard coating layer. The hard coating layer may include any one or more selected from organic matters, inorganic matters, and the like.

According to an aspect of the present invention, the hard coating layer may be a single layer of organic matter or inorganic matter, or a mixed layer of organic matter and inorganic matter, but the present invention is not particularly limited thereto. For example, a hard coating layer which has a strong bond to the polyimide-based film, does not cause light distortion, and, particularly, has an excellent effect of improving a rainbow effect, is preferred.

According to an aspect of the present invention, the hard coating layer is not particularly limited, but may, for example, be a layer including any one or more polymers selected from an acrylic polymer, a silicon-based polymer, an epoxy-based polymer, a urethane-based polymer, and the like.

Specifically, the hard coating layer may be formed of a composition for forming a coating layer, which prevents degradation of optical characteristics when it is formed on the polyimide-based film and includes an epoxysiloxane resin to improve surface hardness.

Specifically, the epoxysiloxane resin may be a siloxane resin including an epoxy group. The epoxy group may be a cyclic epoxy group, an aliphatic epoxy group, an aromatic epoxy group or a mixture thereof. The siloxane resin may be a polymer compound formed through a covalent bond between a silicon atom and an oxygen atom.

Preferably, for example, the epoxysiloxane resin may be a silsesquioxane resin. Specifically, the epoxysiloxane resin may be a compound obtained by directly substituting a silicon atom of the silsesquioxane compound with an epoxy group, or substituting a substituent substituted with the silicon atom with an epoxy group. A non-limiting example of the epoxysiloxane resin may be a silsesquioxane resin substituted with a 2-(3,4-epoxycyclohexyl) group or a 3-glycidoxy group.

The epoxysiloxane resin may be manufactured from only an alkoxysilane having an epoxy group in the presence of water, or manufactured through a hydrolysis and condensation reaction between an alkoxysilane having an epoxy group and a heterologous alkoxysilane. Also, the epoxysilane resin may be formed by polymerizing a silane compound including an epoxycyclohexyl group.

For example, the alkoxysilane compound having an epoxy group may include any one or more selected from 2-(3,4-epoxycyclohexyl)ethyltrimethoxysilane, 2-(3,4-epoxycyclohexyl)ethyltriethoxysilane, 3-glycidoxypropyltrimethoxysilane, and the like.

According to an aspect of the present invention, the epoxysiloxane resin may have a weight average molecular weight of 1,000 to 20,000 g/mol, but the present invention is not limited thereto. When the epoxysiloxane resin has a weight average molecular weight falling within this range, a composition for forming a coating layer may have suitable viscosity. Therefore, the flowability, applicability, curing reactivity, and the like of the composition for forming a coating layer may be improved, and the surface hardness of the hard coating layer may be improved.

According to an aspect of the present invention, the epoxysiloxane resin may be included at 20 to 65% by weight, preferably 20 to 60% by weight, based on the total weight of the composition for forming a coating layer.

Within this range, it is desirable because the surface hardness of the hard coating layer may be further improved, and uniform curing may be induced, thereby preventing physical defects such as cracks, and the like caused by partial overcuring, but the present invention is not limited thereto.

According to an aspect of the present invention, the composition for forming a coating layer may further include a cross-linking agent and an initiator.

The cross-linking agent is not particularly limited as long as it may form a cross-linking bond with an epoxysiloxane resin to solidify the composition for forming a coating layer and may improve the hardness of the hard coating layer. For example, the cross-linking agent may include any one or more selected from (3,4-epoxycyclohexyl)methyl-3',4'-epoxycyclohexane carboxylate, diglycidyl 1,2-cyclohexanedicarboxylate, 2-(3,4-epoxycyclohexyl-5,5-spiro-3,4-epoxy)cyclohexane-metha-dioxane, bis(3,4-epoxycyclohexylmethyl)adipate, bis(3,4-epoxy-6-methylcyclohexyl)adipate, 3,4-epoxy-6-methylcyclohexylmethyl-3',4'-epoxy-6'-methylcyclohexane carboxylate, 1,4-cyclohexanedimethanol, bis(3,4-epoxycyclohexane carboxylate), ethylenebis(3,4-epoxycyclohexane carboxylate), 3,4-epoxycyclohexylmethyl(meth)acrylate, bis(3,4-epoxycyclohexylmethyl)adipate, 4-vinylcyclohexene dioxide, vinylcyclohexene monoxide, 1,4-cyclohexanedimethanol diglycidyl ether, 2,2'-((1-methylethylidene)bis(cyclohexane-4,1-diyloxymethylene))bisoxirane, and the like. Preferably, the cross-linking agent may include any one or more selected from (3,4-epoxycyclohexyl)methyl-3',4'-epoxycyclohexane carboxylate, bis(3,4-epoxycyclohexylmethyl)adipate), and the like, all of which include a compound to which two 3,4-epoxycyclohexyl groups are attached.

According to an aspect of the present invention, a content of the cross-linking agent is not particularly limited, and the cross-linking agent may, for example, be included at 5 to 150 parts by weight, based on 100 parts by weight of the epoxysiloxane resin. According to an aspect of the present invention, the cross-linking agent may also be included at 3 to 30% by weight, preferably 5 to 20% by weight, based on the total weight of the composition for forming a coating layer. Within this range, the applicability and curing reactivity of the composition for forming a coating layer may be improved.

According to an aspect of the present invention, the initiator may be a photoinitiator or a thermal initiator. Preferably, the initiator may be a photoinitiator. For example, the photoinitiator may include a photo-cationic initiator. The photo-cationic initiator may initiate polymerization of the epoxysiloxane resin and an epoxy-based monomer.

Specifically, the photo-cationic initiator may include any one or more selected from an onium salt, an organic metal salt, and the like, but the present invention is not limited thereto. For example, the photo-cationic initiator may include any one or more selected from a diaryliodonium salt, a triarylsulfonium salt, an aryldiazonium salt, an iron-arene complex, and the like, but the present invention is not limited thereto.

According to an aspect of the present invention, a content of the photoinitiator is not particularly limited, but may, for example be included at 1 to 15 parts by weight, based on 100 parts by weight of the epoxysiloxane resin. According to an aspect of the present invention, the cross-linking agent may also be included at 0.1 to 10% by weight, preferably 0.3 to 5% by weight, based on the total weight of the composition for forming a coating layer. When the photoinitiator is included at a content falling within this range, curing efficiency of the hard coating layer may be excellent, and degradation of properties caused by the residual components after curing may be prevented.

According to an aspect of the present invention, the composition for forming a coating layer may further include any one or more additives selected from a filler, a lubricant, a light stabilizing agent, a thermal polymerization inhibitor, a leveling agent, a lubricating agent, an antifoulant agent, a thickening agent, a surfactant, an anti-foaming agent, an antistatic agent, a dispersing agent, an initiator, a coupling agent, an antioxidant, a UV stabilizing agent, a coloring agent, and the like, but the present invention is not limited thereto.

More specifically, the hard coating layer may further include inorganic particles to endow hardness.

The inorganic particles may be preferably silica, more preferably surface-treated silica, but the present invention is not limited thereto. In this case, the surface-treated silica may include a functional group capable of reacting with the aforementioned cross-linking agent.

According to an aspect, the inorganic particles may have an average diameter of 1 to 500 nm, preferably 3 to 300 nm, but the present invention is not limited thereto.

When the hard coating layer as described above is formed on a conventional polyimide-based film, a rainbow effect may not be avoided due to the light distortion. However, the polyimide-based film according to the present invention may realize excellent visibility without causing any rainbow effect even when the hard coating layer is formed on the polyimide-based film as described above.

According to an aspect of the present invention, the window cover film has high surface hardness and excellent flexibility, and thus may be lighter than tempered glass and have excellent durability to deformation. Therefore, the window cover film is excellent as a window substrate of the outermost surface of a flexible display panel.

Still another aspect of the present invention provides a display device including a display panel and the aforementioned window cover film formed on the display panel.

According to an aspect of the present invention, the display device is not particularly limited as long as it is used in the field requiring excellent optical characteristics. In this case, a display panel satisfying this requirement may be selected and provided. Preferably, the window cover film may be applied to a flexible display device. As a specific example, the window cover film may be applied to any one or more image display devices selected from various image display devices such as a liquid crystal display device, an electroluminiscent display device, a plasma display device, a field-emission display device, and the like, but the present invention is not limited thereto.

The display device including the aforementioned window cover film of the present invention may have an excellent display quality and a distortion phenomenon by light may be remarkably reduced. In particular, a rainbow effect in which rainbow-colored smears occur may be remarkably improved, and strain on the users' eye may be minimized due to excellent visibility.

Hereinafter, the present invention will be described with reference to Examples and Comparative Examples thereof. However, it should be understood that the following Examples and Comparative Examples are illustrative only to describe the present invention in detail, but are not intended to limit the present invention.

Hereinafter, the properties were measured, as follows.

1) Evaluation of Peelability

A stacked body was manufactured by attaching a polyimide film manufactured in Preparation Example 1 to a surface of a film on which an antistatic layer was formed using an 8146-1 OCA film (3M), and laminating a protective film (Nitto Denko Corp., RB-200S) having an adhesive force of 12 gf/mm onto a back surface of the film on which an antistatic layer was formed, and cut to manufacture 50 specimens with a size of 25.4 mm×150 mm. The specimens were kept at room temperature for 24 hours, and subjected to a 90° peel test at a peel rate of 300 mm/min. using UTM (Instron Co., Ltd., 3365) to evaluate a degree of peeling-off between a surface of the antistatic layer and a surface of the adherend object (a polyimide film manufactured in Preparation Example 1) and whether or not residues of the protective film remained (⊚: All 50 films are clearly peeled off, ○: A peeling-off phenomenon is observed in not more than 3 films, Δ: Peeling-off is observed in 10 or more films, and X: Peeling-off is observed in 25 or more films).

2) Measurement of surface resistance and calculation of surface resistance change The surface resistance of the antistatic coating layer was measured under conditions of 25° C. and 50% using a surface resistance measuring machine (Mitsubishi Chemical Corp., HIRESTA-UX) according to JIS K6911 to obtain an average of surface resistances value measured in quintuple.

To calculate a surface resistance change, the manufactured film was kept at 150° C. for 10 minutes, and measured for surface resistance using the same method as described above. Then, the surface resistance change was calculated according to the following Equation 1. When the surface resistance change is less than or equal to 3 orders of magnitude, it is desirable because changes in thermal stability and antistatic characteristics were small in subsequent processes such as hard coating layer formation, and the like.

Surface Resistance Change=Surface Resistance after Heat Treatment/Surface Resistance before Heat Treatment 3) Modulus The modulus of a polyamide-imide film having a length of 50 mm and a width of 10 mm was measured under a condition in which the polyamide-imide film was pulled at 25° C. and 50 mm/min. using UTM 3365 (Instron Co., Ltd.) according to ASTM D882.

A thickness of the film was measured to enter a device. The unit of modulus is GPa.

4) Break Elongation

The break elongation of a polyamide-imide film having a length of 50 mm and a width of 10 mm was measured under a condition in which the polyamide-imide film was pulled at 25° C. and 50 mm/min. using UTM 3365 (Instron Co., Ltd.) according to ASTM D882.

A thickness of the film was measured to enter a device. The unit of break elongation is percentage (%).

5) Light Transmittance

The total light transmittance of a film having a thickness of 50 μm was measured in a whole wavelength region of 400 to 700 nm using a spectrophotometer (Nippon Denshoku Industries Co., Ltd., COH-400), and the single-wavelength light transmittance of the film was measured at 388 nm using UV/Vis (Shimadzu Corp., UV3600) according to the ASTM D1746 standard. The unit is percentage (%).

6) Haze

The haze of a film having a thickness of 50 μm was measured using a spectrophotometer (Nippon Denshoku Industries Co., Ltd., COH-400) according to the ASTM D1003 standard. The unit is percentage (%).

7) Yellow Index (YI) and b* Value

The yellow index (YI) and b* value of a film having a thickness of 50 μm were measured using a colorimeter (HunterLab Ltd., ColorQuest XE) according to the ASTM E313 standard.

8) Pencil Hardness

The pencil hardness of a film was measured under a load of 750 g according to JISK5400 by drawing lines with a length of 20 mm at a rate of 120 mm/sec. based on the hardness of a pencil (Mitsubishi Chemical Corp.,) and repeating this process 5 times. In this case, the pencil hardness was measured when scratches are generated two or more times.

Preparation Example 1

Manufacture of Composition for Forming Base Layer

Terephthaloyl dichloride (TPC) and 2,2'-bis(trifluoromethyl)-benzidine (TFMB) were added to a mixed solution of dichloromethane and pyridine in a reactor, and stirred at 25° C. for 2 hours under a nitrogen atmosphere. In this case, the TPC and the TFMB were used at a molar ratio of 300:400, and the solid contents were adjusted to 10% by weight. Thereafter, the reaction product was precipitated in an excessive amount of methanol, and filtered. Then, the resulting solid contents were vacuum-dried at 50° C. for 6 hours or more to yield an oligomer. A formula weight (FW) of the manufactured oligomer was 1,670 g/mol.

N,N-dimethylacetamide (DMAc) as the solvent, 100 moles of the oligomer, and 28.6 moles of 2,2'-bis(trifluoromethyl)-benzidine (TFMB) were put into a reactor, and stirred thoroughly. After it was confirmed that a solid raw material was completely dissolved, fumed silica (having a surface area of 95 m$^2$/g, <1 μm) was added to DMAc at a content of 1,000 ppm relative to the solid contents, dispersed using ultrasonic waves, and then put into the reactor. 64.3 moles of cyclobutanetetracarboxylic dianhydride (CBDA) and 64.3 moles of 4,4'-hexafluoroisopropylidene diphthalic anhydride (6FDA) were sequentially added, and stirred thoroughly. Then, the resulting mixture was polymerized at 40° C. for 10 hours. In this case, the solid content was 15%. Subsequently, pyridine and an acetic anhydride were sequentially added to a solution, respectively, at 2.5-fold moles relative to the total dianhydride content, and stirred at 60° C. for 12 hours.

After the polymerization was completed, the polymerization solution was precipitated in an excessive amount of methanol, and then filtered. Then, the resulting solid contents were vacuum-dried at 50° C. for 6 hours or more to yield a polyamide-imide powder. The powder was diluted to 20% by weight and dissolved in DMAc to manufacture a composition for forming a base layer.

The composition for forming a base layer was applied onto a glass support using an applicator, dried at 80° C. for 30 minutes and then at 100° C. for an hour, and then cooled at room temperature to manufacture a film. Thereafter, stepwise heat treatment was carried out at 100 to 200° C. and 250 to 300° C. for 2 hours at a heating rate of 20° C./min.

The properties of the manufactured polyamide-imide base layer were measured. As a result, the polyamide-imide base layer had a thickness of 50 μm, a total light transmittance of 89.73%, a haze of 0.4%, a yellow index (YI) of 1.9, a b* value of 1.0, a modulus of 6.5 GPa, a break elongation of 21.2%, a weight average molecular weight of 310,000 g/mol, a polydispersity index (PDI) of 2.11, and a pencil hardness of HB/750 g.

Preparation Example 2

Manufacture of Coating Composition for Forming Antistatic Layer

1) Manufacture of Modified Carbon Nanotube Dispersion 15 parts by weight of single-walled carbon nanotubes (having a length of 15 μm and an average diameter of 4 nm) was added based on 100 parts by weight of a nitric acid solution (50% by weight), modified at 60° C. for 4 hours, and then filtered. Thereafter, the resulting reaction product was sufficiently washed with purified water, and dried to manufacture carbon nanotubes surface-modified with nitric acid. Then, 1 g of the modified multi-walled carbon nanotubes surface-treated with nitric acid were dispersed in 100 g of isopropyl alcohol using ultrasonic waves to manufacture a modified carbon nanotube dispersion.

2) Manufacture of Organic-Inorganic Binder Resin Solution 8 g of tetraethoxysilane (TEOS; Aldrich Co., Ltd.) and 2 g of methacryloyloxypropyltrimethoxysilane (MPTMS; Aldrich Co., Ltd.) were added to a 50 mL round-bottom flask, and 22% by weight of distilled water, 1% by weight of HCl, and 25% by weight of a mixed solvent (toluene, isopropyl alcohol, ethylacetate, and 2-ethoxyethanol were mixed at a mass ratio of 2:1:1:1) were added relative to the mass of the silane compound, and stirred at room temperature for 3 hours to manufacture a silsesquioxane-based organic-inorganic binder resin solution.

3) Coating Composition for Forming Antistatic Layer 1 part by weight of a dispersion of the modified carbon nanotubes (having a length of 15 μm and an average diameter of 4 nm) and 0.2 parts by weight of a thermal initiator tris(dibutylsulfide)trichloride (Aldrich Co., Ltd.) were added based on 100 parts by weight of the organic-inorganic binder resin solution, to manufacture a coating composition for forming an antistatic layer.

Preparation Example 3

Manufacture of Coating Composition for Forming Antistatic Layer

A coating composition for forming an antistatic layer was manufactured in the same manner as in Preparation Example 2, except that multi-walled carbon nanotubes (having a length of 15 μm and an average diameter of 4 nm) were used.

Preparation Example 4

Manufacture of Coating Composition for Forming Antistatic Layer

A coating composition for forming an antistatic layer was manufactured in the same manner as in Preparation Example 2, except that single-walled carbon nanotubes (having a length of 25 μm and an average diameter of 4 nm) were used.

Preparation Example 5

Manufacture of Coating Composition for Forming Antistatic Layer

A coating composition for forming an antistatic layer was manufactured in the same manner as in Preparation Example 2, except that multi-walled carbon nanotubes (having a length of 25 µm and an average diameter of 4 nm) were used.

Preparation Example 6

Manufacture of Coating Composition for Forming Antistatic Layer 5 parts by weight of pentaerythritol tetraacrylate (Miwon Specialty Chemical Co., Ltd., M340), 3 parts by weight of 1-hydroxycyclohexyl phenyl ketone as a photoinitiator, and 22 parts by weight of a conductive polymer solution (Daeha Mantech Co., Ltd., ELcoat UVH, Solid content of 30%) as an antistatic agent were added to manufacture a composition.

Preparation Example 7

Manufacture of Coating Composition for Forming Antistatic Layer 22 parts by weight of pentaerythritol tetraacrylate (Miwon Specialty Chemical Co., Ltd., M340), 3 parts by weight of 1-hydroxycyclohexyl phenyl ketone as a photoinitiator, and 5 parts by weight of an acrylic ionic liquid (Sooyang Chemtec Co., Ltd., QM352) as an antistatic agent were added to manufacture a composition.

Preparation Example 8

Manufacture of Composition for Forming Hard Coating Layer 2-(3,4-epoxycyclohexyl)ethyltrimethoxysilane (ECTMS, TCI Co., Ltd.) and water were mixed at a ratio of 24.64 g:2.70 g(0.1 mol:0.15 mol) to manufacture a reaction solution. Then, the reaction solution was put into a 250 mL 2-neck flask. 0.1 mL of a tetramethylammonium hydroxide (Aldrich Co., Ltd.) catalyst and 100 mL of tetrahydrofuran (Aldrich Co., Ltd.) were added to the mixture, and stirred at 25° C. for 36 hours. Thereafter, layer separation was carried out, and a product layer was extracted with methylenechloride (Aldrich Co., Ltd.), and the extract was dehydrated over magnesium sulfate (Aldrich Co., Ltd.), and vacuum-dried to remove the solvent, thereby obtaining an epoxy siloxane-based resin. The epoxy siloxane-based resin was measured by gel permeation chromatography (GPC). As a result, the epoxy siloxane-based resin has a weight average molecular weight of 2,500 g/mol.

30 g of the silsesquioxane resin, 10 g of (3',4'-epoxycyclohexyl)methyl 3,4-epoxycyclohexane carboxylate as a cross-linking agent, 5 g of bis[(3,4-epoxycyclohexyl) methyl] adipate, 0.5 g of (4-methylphenyl)[4-(2-methylpropyl)phenyl]iodoniumhexafluorophosphate as a photoinitiator, and 54.5 g of methyl ethyl ketone were mixed to manufacture a composition.

EXAMPLE 1

The antistatic coating composition manufactured in Preparation Example 2 was applied onto one surface of the polyamide-imide film manufactured in Preparation Example 1 using Myer Bar #6, and cured at 70° C. for 5 minutes to manufacture an antistatic polyimide film. The properties of the film were measured. The results are listed in the following Table 1.

EXAMPLE 2

This example was carried out in the same manner as in Example 1, except that the antistatic coating composition manufactured in Preparation Example 3 was used. The properties of the film were measured. The results are listed in the following Table 1.

EXAMPLE 3

This example was carried out in the same manner as in Example 1, except that the antistatic coating composition manufactured in Preparation Example 4 was used. The properties of the film were measured. The results are listed in the following Table 1.

EXAMPLE 4

This example was carried out in the same manner as in Example 1, except that the antistatic coating composition manufactured in Preparation Example 5 was used. The properties of the film were measured. The results are listed in the following Table 1.

EXAMPLE 5

The hard coating composition manufactured in Preparation Example 8 was applied onto a back surface of the antistatic coating layer in Example 1 using Meyer Bar #18, dried at 60° C. for 5 minutes, irradiated with UV rays at 1 J/cm² using a high-pressure metal lamp, and then cured at 120° C. for 15 minutes to form a hard coating layer having a thickness of 10 µm. The properties of the film were measured. The results are listed in the following Table 1.

EXAMPLE 6

The hard coating composition manufactured in Preparation Example 8 was applied onto a top surface of the antistatic coating layer in Example 1 using Meyer Bar #18, dried at 60° C. for 5 minutes, irradiated with UV rays at 1 J/cm² using a high-pressure metal lamp, and then cured at 120° C. for 15 minutes to form a hard coating layer having a thickness of 10 µm. The properties of the film were measured. The results are listed in the following Table 1.

Comparative Example 1

The hard coating composition manufactured in Preparation Example 6 was applied onto one surface of the polyamide-imide film manufactured in Preparation Example 1 using Myer Bar #6, dried at 70° C. for 5 minutes, irradiated with UV rays at 1 J/cm² using a high-pressure metal lamp, and then cured to manufacture an antistatic polyimide film. The properties of the film were measured. The results are listed in the following Table 2.

Comparative Example 2

The antistatic coating composition manufactured in Preparation Example 7 was applied onto one surface of the polyamide-imide film manufactured in Preparation Example 1 using Myer Bar #6, dried at 70° C. for 5 minutes, irradiated with UV rays at 1 J/cm² using a high-pressure metal lamp, and then cured to manufacture an antistatic polyimide film. The properties of the film were measured. The results are listed in the following Table 2.

Comparative Example 3

This example was carried out in the same manner, except that the polyamide-imide film manufactured in Preparation Example 1 was not coated with an antistatic agent. The properties of the film were measured. The results are listed in the following Table 2.

TABLE 1

|  |  | Example 1 | Example 2 | Example 3 | Example 4 | Example 5 | Example 6 |
|---|---|---|---|---|---|---|---|
| Base layer | Total light transmittance (%) | 89.73 | 89.73 | 89.73 | 89.73 | 89.73 | 89.73 |
|  | Haze (%) | 0.4 | 0.4 | 0.4 | 0.4 | 0.4 | 0.4 |
|  | YI (%) | 1.9 | 1.9 | 1.9 | 1.9 | 1.9 | 1.9 |
|  | b* | 1.0 | 1.0 | 1.0 | 1.0 | 1.0 | 1.0 |
| Antistatic film | Antistatic layer/hard coating layer | Preparation Example 2 | Preparation Example 3 | Preparation Example 4 | Preparation Example 5 | Preparation Example 2/Preparation Example 8 | Preparation Example 2/Preparation Example 8 |
|  | Surface resistance (Ω/□) | $10^8$ | $10^9$ | $10^9$ | $10^{10}$ | $10^{10}$ | $10^{10}$ |
|  | Surface resistance (Ω/□) after treatment at 150° C. for 10 minutes | $10^8$ | $10^{10}$ | $10^{10}$ | $10^{12}$ | $10^{12}$ | $10^{13}$ |
|  | Surface resistance change | No change | 1 order of magnitude | No change | 1 order of magnitude | 2 orders of magnitude | 3 orders of magnitude |
|  | Protective film's peelability | ◉ | ◉ | ◉ | ○ | ○ | ○ |
|  | Protective film's peelability after treatment at 150° C. for 10 minutes | ◉ | ◉ | ◉ | Δ | Δ | Δ |
|  | Total light transmittance (%) | 90.9 | 90.7 | 90 | 90.1 | 90.9 | 90.8 |
|  | Haze (%) | 0.6 | 0.5 | 0.9 | 0.9 | 0.8 | 0.7 |
|  | YI | 1.8 | 1.8 | 1.7 | 1.8 | 1.9 | 1.9 |
|  | b* | 0.9 | 0.9 | 0.9 | 1.0 | 1.0 | 0.9 |

(◉: 50 films are clearly peeled off, ○: A peeling-off phenomenon is observed in not more than 3 films, Δ: Peeling-off is observed in 10 or more films, and X: Peeling-off is observed in 25 or more films)

TABLE 2

|  |  | Comparative Example 1 | Comparative Example 2 | Comparative Example 3 |
|---|---|---|---|---|
| Base layer | Total light transmittance (%) | 89.73 | 89.73 | 89.73 |
|  | Haze (%) | 0.4 | 0.4 | 0.4 |
|  | YI (%) | 1.9 | 1.9 | 1.9 |
|  | b* | 1.0 | 1.0 | 1.0 |
| Antistatic film | Antistatic layer/hard coating layer | Preparation Example 6 | Preparation Example 7 | None |
|  | Surface resistance (Ω/□) | $10^{12}$ | $10^{11}$ | Over |
|  | Surface resistance (Ω/□) after treatment at 150° C. for 10 minutes | Over | Over | Over |
|  | Surface resistance change | Greater than 3 orders of magnitude | Greater than 3 orders of magnitude | Over |
|  | Protective film peelability | Δ | ○ | X |
|  | Protective film's peelability after treatment at 150° C. for 10 minutes | X | X | X |
|  | Total light transmittance (%) | 87.5 | 88.5 | — |
|  | Haze (%) | 1.3 | 1.4 | — |
|  | YI | 2.5 | 2.4 | — |
|  | b* | 1.3 | 1.2 | — |

(◉: 50 films are clearly peeled off, ○: A peeling-off phenomenon is observed in not more than 3 films, Δ: Peeling-off is observed in 10 or more films, and X: Peeling-off is observed in 25 or more films)

According to one aspect of the present invention, the antistatic polyimide-based film, which has an excellent effect of endowing antistatic characteristics and simultaneously has high-transmittance characteristics, can be provided.

Also, according to the present invention, the antistatic polyimide-based film, which has a small change in surface resistance even after the film is maintained under a high-temperature condition, can be provided.

According to the present invention, the window cover film, in which a phenomenon in which an adhesive component of a protective film remains on the film or various stacked bodies are peeled off from the window cover film does not occur by removing the occurrence of static electricity when a protective film for protecting the window cover film is peeled off, can be provided.

Also, the present invention can provide the window cover film in which problems such as peeling-off of the stacked bodies, such as OCA, OCR, or the like, which are stacked between layers of the window cover film or stacked on the window cover film, when a protective film is peeled off from the window cover film, are improved.

In addition, the present invention has an effect of improving optical characteristics such as light transmittance, yellow index, and the like.

Further, according to the present invention, productivity can be enhanced and working reliability and stability can be improved during the manufacture of display panels.

Although the present invention has been described with reference to certain subject matters and limited examples thereof, and the accompanying drawings, it should be understood that the subject matters and the limited examples are merely provided to aid in understanding the present invention more comprehensively, but are not intended to limit the present invention. Therefore, it will be apparent to those skilled in the art to which the present invention belongs that various changes and modifications can be made from such description.

Thus, the scope of the present invention is not intended to be limited to the examples described herein, and thus all types of the appended claims, and equivalents or equivalent modifications thereof come within the scope of the present invention.

DETAILED DESCRIPTION OF MAIN ELEMENTS

10: polyimide-based base layer
20: antistatic layer
30: hard coating layer
100: first aspect of antistatic polyimide-based film
200: second aspect of antistatic polyimide-based film
300: third aspect of antistatic polyimide-based film
400: fourth aspect of antistatic polyimide-based film

What is claimed is:

1. An antistatic polyimide-based film comprising:
a polyimide-based base layer; and
an antistatic layer formed on one or both surfaces of the base layer and having a surface resistance of $10^7 \Omega/\square$ or more,
wherein the antistatic polyimide-based film has a total light transmittance of 89% or more, a haze of 1.2% or less, a yellow index of 3.0 or less, and a b* value of 1.5 or less.

2. The antistatic polyimide-based film of claim 1, wherein the antistatic polyimide-based film has a surface resistance change of $1 \times 10^3$ or less, as measured according to the following Equation 1, after being maintained at 150° C. for 10 minutes.

Surface Resistance Change=Surface Resistance after Heat Treatment/Surface Resistance before Heat Treatment [Equation 1]

3. The antistatic polyimide-based film of claim 1, wherein the antistatic layer comprises modified carbon nanotubes surface-treated with an inorganic acid, and an organic-inorganic binder resin.

4. The antistatic polyimide-based film of claim 3, wherein the antistatic layer comprises 0.01 to 5 parts by weight of the modified carbon nanotubes surface-treated with the inorganic acid, based on 100 parts by weight of the organic-inorganic binder resin.

5. The antistatic polyimide-based film of claim 3, wherein the organic-inorganic binder resin is derived from any one or two or more inorganic precursors selected from tetraalkoxysilane, trialkoxysilane, dialkoxysilane, monoalkoxysilane, and colloid silica; and
any one or two or more silane coupling agents selected from vinyl trichlorosilane, vinyltris(β-methoxyethoxy)silane, vinyl triethoxysilane, vinyl trimethoxysilane, 3-methacryloxypropyl-trimethoxysilane, β-(3,4-epoxycyclohexyl)-ethyltrimethoxysilane, γ-glycidoxypropyl-trimethoxysilane, glycidoxypropyl-trimethoxysilane, γ-glycidoxypropyl-methylidiethoxysilane, N-β-(aminoethyl)-γ-aminopropyl-trimethoxysilane, N-β-(aminoethyl)-γ-aminopropyl-methyldimethoxysilane, 3-aminopropyl-triethoxysilane, N-phenyl-γ-aminopropyl-trimethoxysilane, and γ-mercaptopropyl-trimethoxysilane.

6. The antistatic polyimide-based film of claim 1, wherein the base layer has a modulus of 3 GPa or more and a break elongation of 8% or more, as measured according to ASTM D882, has a light transmittance of 5% or more, as measured at 388 nm according to ASTM D1746, and has a total light transmittance of 87% or more, as measured at 400 to 700 nm, a haze of 2.0% or less, a yellow index of 5.0 or less, and a b* value of 2.0 or less.

7. The antistatic polyimide-based film of claim 1, wherein the base layer has a polyamide-imide structure.

8. The antistatic polyimide-based film of claim 7, wherein the base layer comprises a unit derived from a fluorine-based aromatic diamine, a unit derived from an aromatic dianhydride, a unit derived from an alicyclic dianhydride, and a unit derived from an aromatic diacid dichloride.

9. The antistatic polyimide-based film of claim 1, wherein the base layer has a thickness of 10 to 500 μm, and the antistatic layer has a thickness of 1 nm to 1 μm.

10. A window cover film comprising:
the antistatic polyimide-based film of claim 1; and
a coating layer formed between a base layer and an antistatic layer of the antistatic polyimide-based film or formed on a back surface of the antistatic layer or the antistatic layer.

11. The window cover film of claim 10, wherein the coating layer comprises any one or more selected from a hard coating layer, an anti-fingerprint layer, an anti-fouling layer, an anti-scratch layer, a low-refractive index layer, an anti-reflective layer, and an impact absorption layer.

12. A flexible display panel comprising the antistatic polyimide-based film of claim 1.

* * * * *